(12) United States Patent
Dang et al.

(10) Patent No.: US 7,598,727 B1
(45) Date of Patent: Oct. 6, 2009

(54) PROBE CARD HEAD PROTECTION DEVICE FOR WAFER SORT SET UP

(75) Inventors: Elvin P. Dang, San Jose, CA (US); Mohsen Hossein Mardi, Saratoga, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/519,468

(22) Filed: Sep. 12, 2006

(51) Int. Cl.
*G01R 31/28* (2006.01)
(52) U.S. Cl. .................................. 324/158.1
(58) Field of Classification Search .......... 324/754, 324/761–762, 765, 158.1, 760, 757–758, 324/755; 439/135–150, 157, 159
See application file for complete search history.

(56) References Cited

U.S. PATENT DOCUMENTS

| | | | | |
|---|---|---|---|---|
| 5,026,295 A | * | 6/1991 | Fong et al. | 439/135 |
| 5,444,386 A | * | 8/1995 | Mizumura | 324/754 |
| 5,597,317 A | * | 1/1997 | Hansell et al. | 439/289 |
| 5,746,611 A | * | 5/1998 | Brown et al. | 439/135 |
| 6,354,844 B1 | * | 3/2002 | Coico et al. | 439/66 |
| 6,960,923 B2 | * | 11/2005 | Eldridge et al. | 324/754 |

* cited by examiner

*Primary Examiner*—Ha Tran T Nguyen
*Assistant Examiner*—Tung X Nguyen
(74) *Attorney, Agent, or Firm*—Thomas A. Ward; Michael R. Hardaway; Michael T. Wallace

(57) ABSTRACT

A protective mechanism for a probe card cover to prevent the probe card cover or attachment screws extending from the probe card cover from striking a wafer in a test system if the probe card is installed without removing the cover. The protective mechanism includes an elongate member that can be permanently attached to the probe card cover, or attached by screws to the probe card cover. The protective mechanism can be a bar that extends longer than an opening in a probe card holder tray through which probes of the probe card pass during testing. The bar can be hard, yet flexible enough to prevent damage to the probe card holder tray or probe card.

14 Claims, 6 Drawing Sheets

PROBE CARD HEAD PROTECTION DEVICE FOR WAFER SORT SET UP

BACKGROUND

1. Technical Field

Embodiments of the present invention relate to probe cards with probes used to test components on a wafer during manufacture. More particularly, the present invention relates to protection mechanisms for the probe card to prevent damage to the probes and to prevent damage to the wafer being tested.

2. Related Art

FIG. 1 shows typical components for testing a wafer using a probe card. The test system components include the probe card (or probe head) 2, the protective cover 4 attached to the probe card by screws 8, a probe card holder tray 10, wafer 12 and prober (or prober chuck) 14. The probe card 2 includes probes 6 for contacting pads of circuits on the wafer 12 to perform tests during fabrication of components before the wafer is diced up into the individual circuits (e.g., programmable logic devices) for packaging. The protective cover 4 is attached to prevent damage to the probes 6 during transportation of the probe card 2, and when the probe card 2 is not in use.

FIG. 2 shows the test typical components for testing the wafer 12 of FIG. 1, but with the protective cover 4 of the probe card 2 removed for testing. In FIG. 2, the probe card 2 is placed in the holder tray 10 so that the probes 6 and parts of the probe card 2 pass through an opening 11 in the holder tray. The probe card 2 is mounted in the holder tray 10 using attachment mechanisms not shown. During testing, the prober 14 operates to precisely lift the wafer 12 to contact the probes 6 of the probe card 2. The probes in one exemplary device extend 8 millimeters (0.315 inches) from the base of the probe card 2. The prober chuck 14 moves within precise limits to assure contact of circuits on the wafer 12, while preventing damage to the probes 6 or the circuits being tested.

FIG. 3 illustrates the effect if the probe card 2 is placed in the holder tray 10 and testing begins before the protective cover 4 is removed. The system shown allows the probe card 2 to be placed on the probe card holder tray 10 even when the probe head cover 4 is still on the probe card 2. The cover 4 and attachment screws 8 extend through the opening 11 in the probe card holder tray 10 significantly below the 8 millimeters depth of the probes 6. Accordingly, if testing is started before the cover 4 is removed, the wafer 12 can strike the attachment screws 8, possibly causing damage to both the wafer and to the probe card. An incorrect probe card depth (i.e., longer than the required depth of probes 6 in this case) can result in damage to the probe head and wafer 12 if the wafer 12 is lifted by the prober chuck 14. The thickness of the probe head cover 4 and two long screws 8 add to create a total depth to about 24 millimeters, or 0.900 inches, beyond the required 8 millimeter probe depth. Both the probe card 2, and wafer 12 with potentially hundreds of complex circuits are costly to replace.

SUMMARY

According to embodiments of the present invention, a protective mechanism is provided for a probe card cover to prevent the probe card cover, or attachment screws extending from the probe card cover, from striking a wafer in a test system if installation of the probe card is attempted without removing the cover.

The protective mechanism in one embodiment includes an elongate member that is attached with the probe card cover to the probe card. The elongate member in one embodiment is a bar that is attached with the probe card cover attachment screws to the probe card. The bar can also be permanently attached to the probe card cover, or formed as part of the probe card cover. The bar extends longer than an opening in a probe card holder tray to limit the amount the cover can pass through the holder tray if the cover is left on by accident. The bar can be flexible to prevent damage to the probe card holder tray or probe card when the bar strikes the probe card holder tray, yet hard enough to prevent the cover from extending significantly through the holder tray.

Embodiments of the present invention, thus, solve the problem of damage to the probe head and breaking of wafers that can occur when an operator is setting up the probe card and forgets to remove the probe head cover. Embodiments of the invention help save the cost involved to rebuild a new probe card that is damaged, or the cost of replacing an entire wafer that can likewise be damaged. Embodiments of the present invention do not allow the probe card to be placed inside the probe card holder tray without removing the probe head cover.

BRIEF DESCRIPTION OF THE DRAWINGS

Further details of the present invention are explained with the help of the attached drawings, in which.

DETAILED DESCRIPTION

Figure 1:
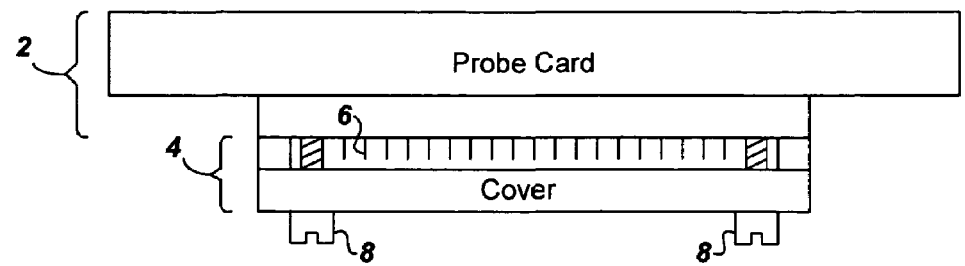
FIG. 1 shows typical components for testing a wafer using a probe card including the probe card tray holder, wafer, prober chuck, and probe card with protective cover still attached prior to testing.
Figure 1:
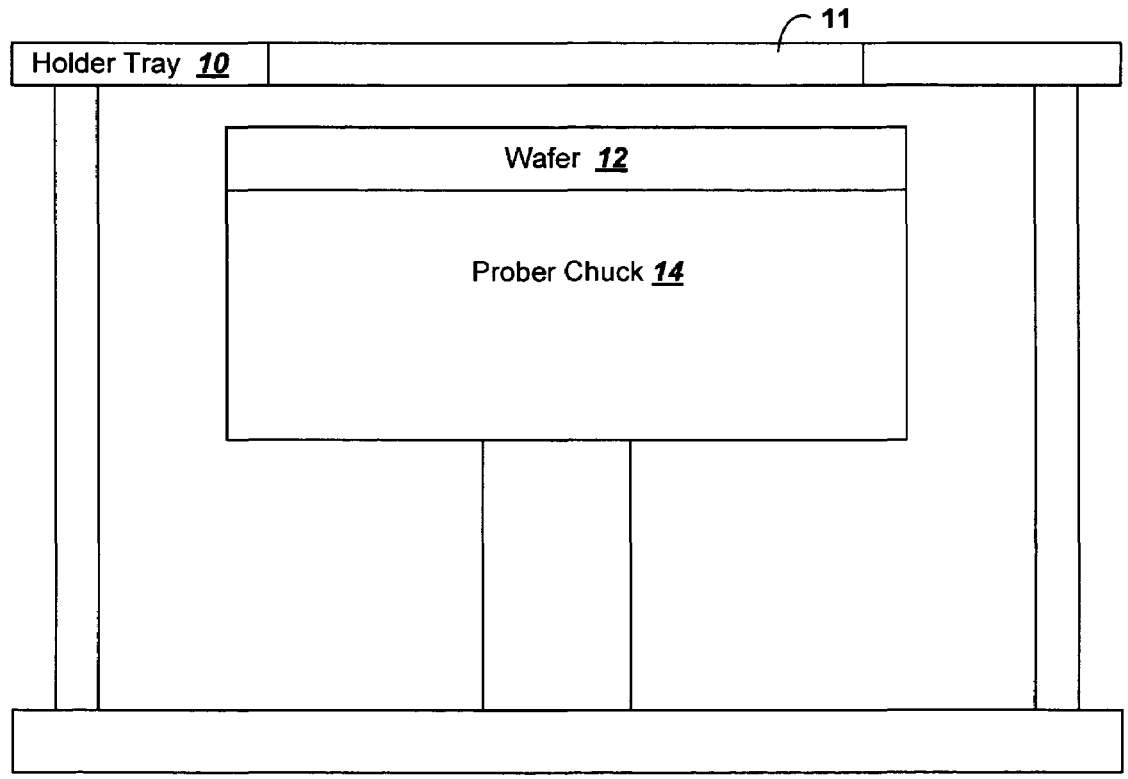
Figure 2:
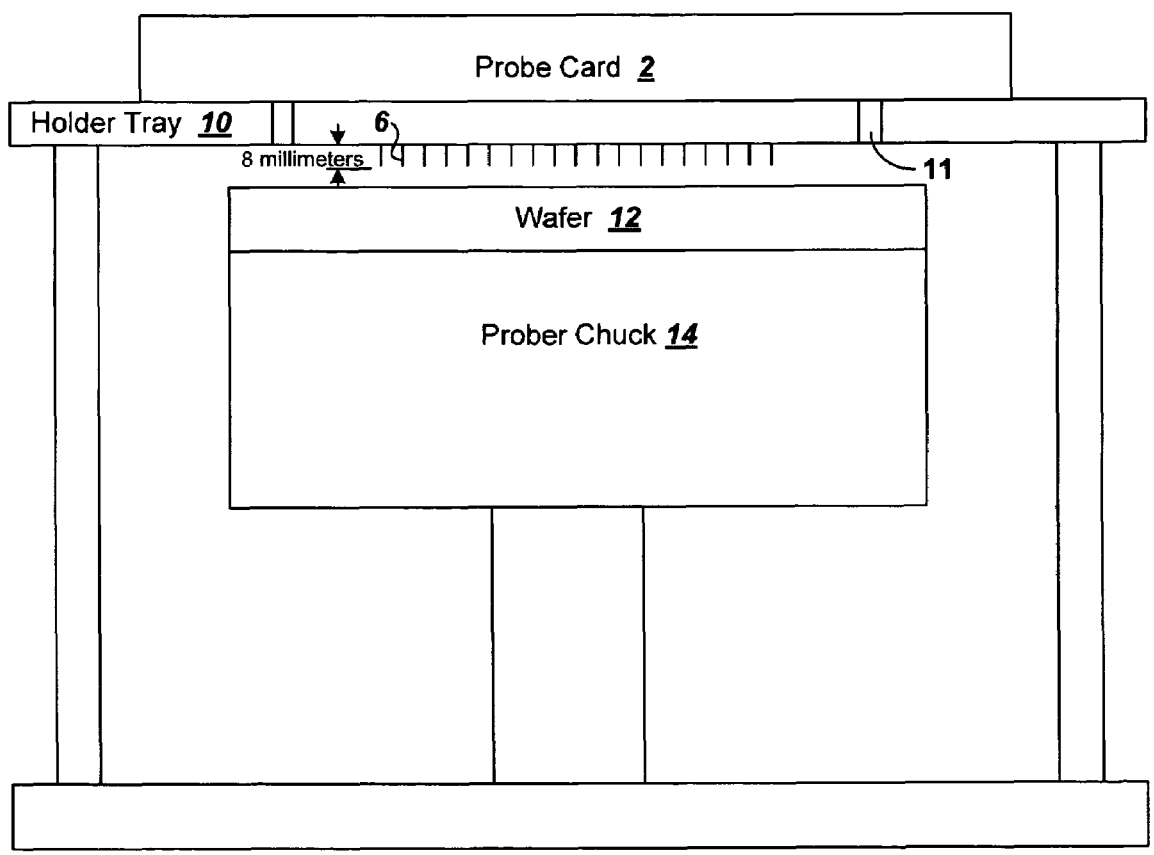
FIG. 2 shows the typical components for testing a wafer using a probe card with the protective cover of the probe card removed, and the probe card placed in the tray holder.
Figure 3:
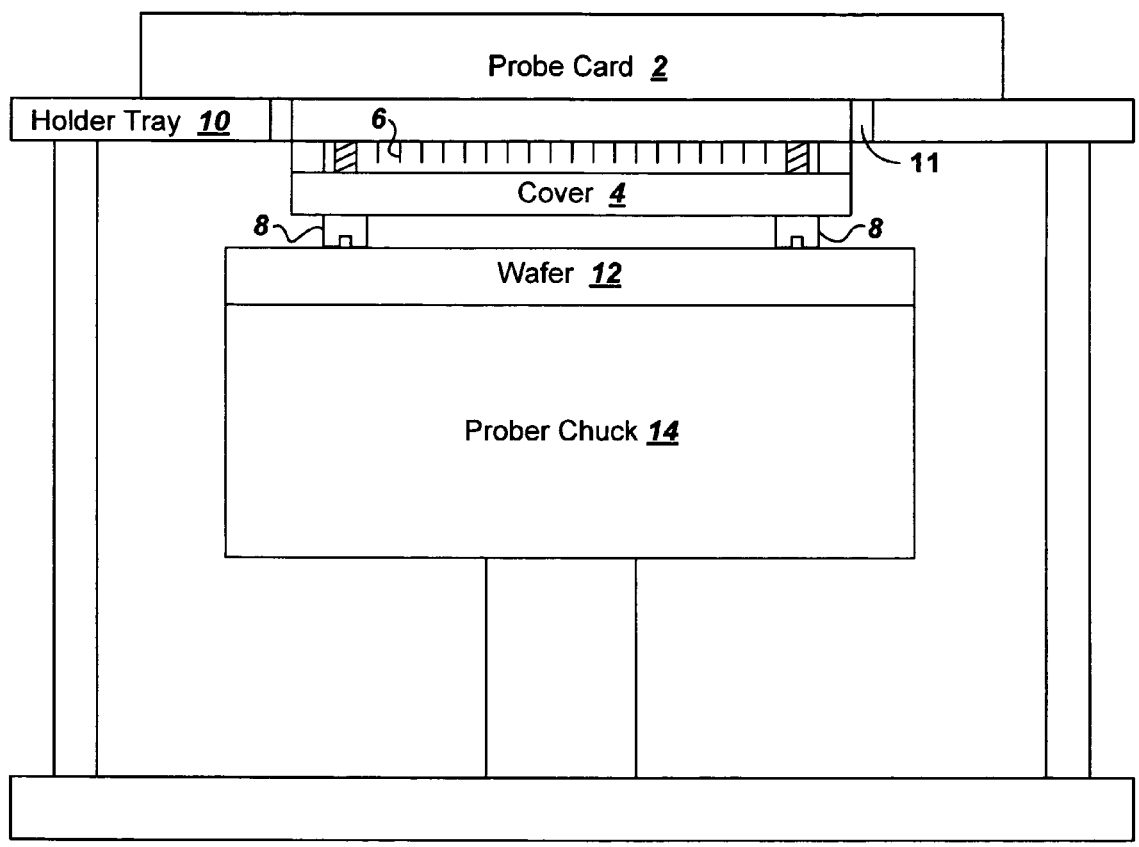
FIG. 3 illustrates the effect if the probe card is placed in the tray holder and testing begins before the protective cover is removed.
Figure 4:
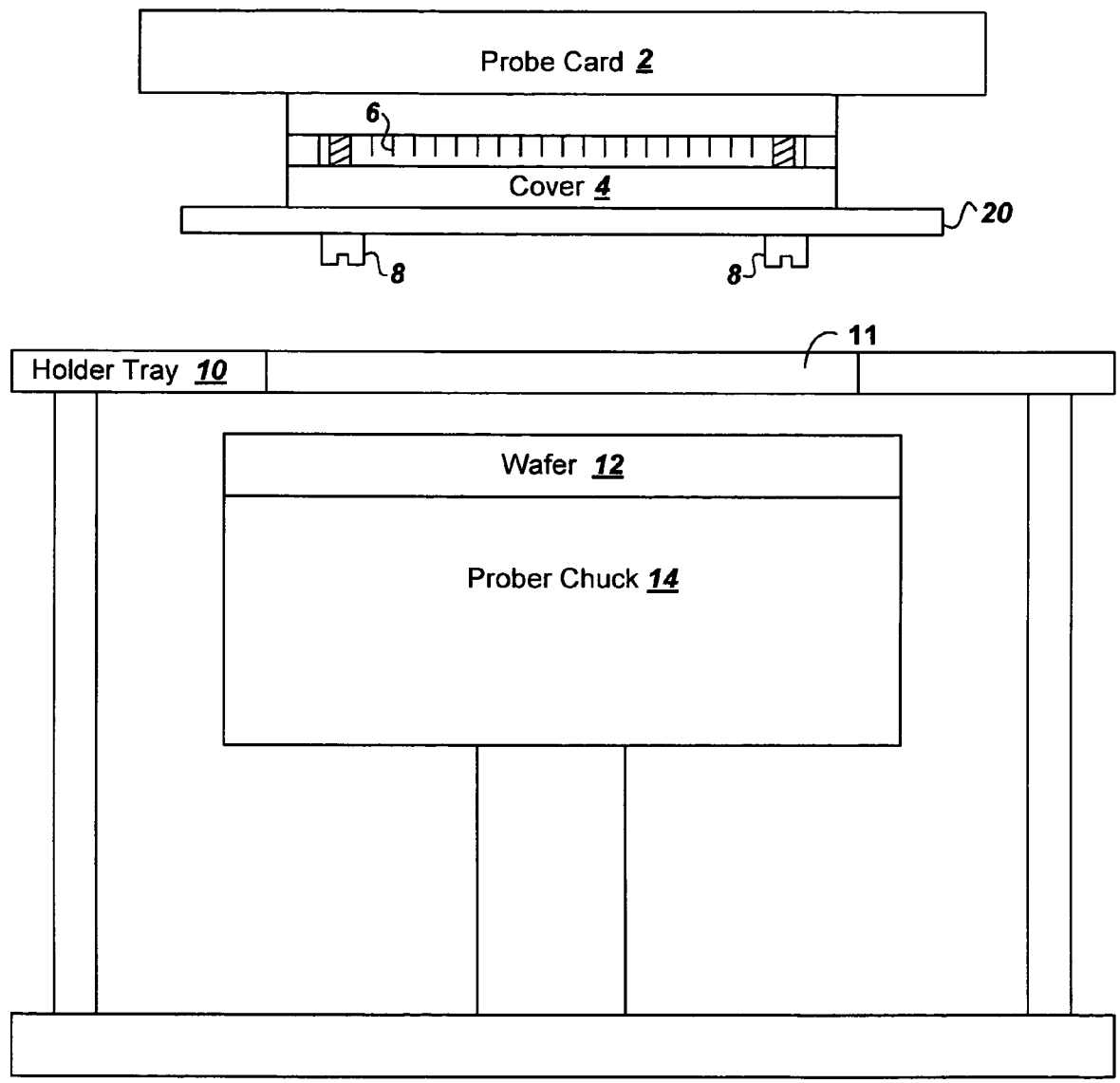
FIG. 4 shows a protective bar that can be installed in accordance with embodiments of the present invention so that if the protective cover over the probe card is not removed, the probe card cover will not strike the wafer.

FIG. 4 shows the elongate protective member 20 that can be installed in accordance with embodiments of the present invention. With the elongate protective member 20 installed, if the protective cover 4 over the probe card 2 is not removed before attempting installation, the probe card cover screws 8 will not strike the wafer 12. The structural difference from the normal probe card cover 4 is that the elongate protective member 20 is longer than the diameter of the probe card holder tray opening 11.

In one embodiment, the elongate protective member 20 is a bar. The bar can be cylindrical, rectangular, or other geometrical form in shape. Holes are drilled through the bar, or formed into the bar through which the attachment screws 8 are placed. In another embodiment, the elongate protective member 20 is planar. The planar member can be circular, square, rectangular or other geometric shape in accordance with the present invention. Again, holes can be drilled or formed in the planar protective member through which the attachment screws are placed.

In some embodiments, the elongate protective member 20 is formed from a material sufficiently hard enough to prevent the probe card cover attachment screws 8 from extending significantly into the holder tray opening 11. Additionally, in some embodiments, the elongate protective member 20 is flexible to the extent to prevent damage to the holder tray 10, as well as the cover plate 4 or probe card 2. As an example, the elongate protective member can be a polymer, or a soft metal such as aluminium.

Figure 5:
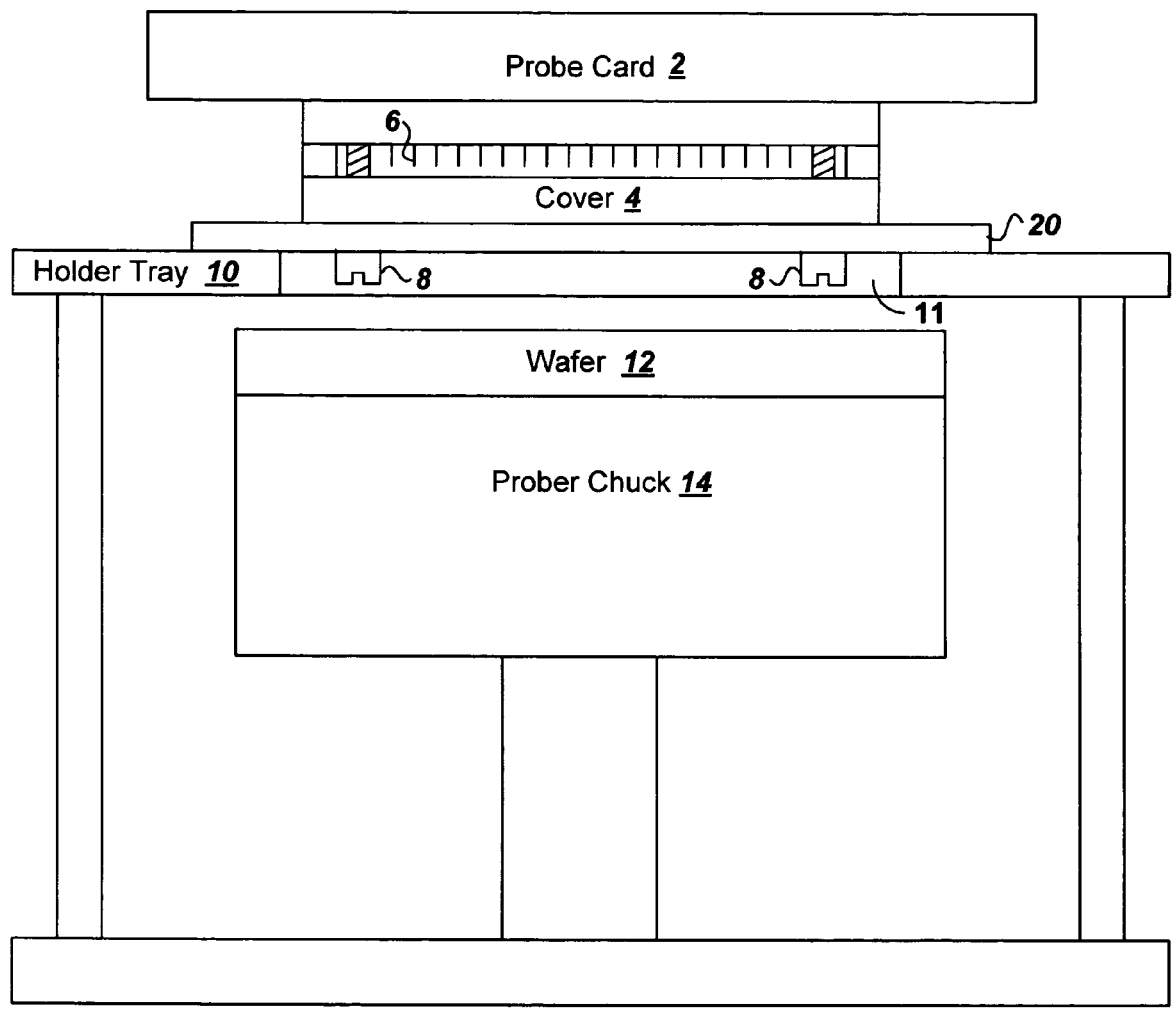
FIG. 5 illustrates the effect if the probe card is placed in the tray holder before the protective cover is removed when the protective bar is installed.

FIG. 5 illustrates the effect if the probe card 2 is placed in the tray holder 10 before the protective cover 4 is removed when the protective elongate member 20 is installed. As illustrated, the protective elongate member 20 does not allow the probe card 2 to be successfully placed on the probe card holder tray 10. The elongate protective member 20 further prevents a portion of the probe card 2 from extending through the opening 11 in the holder tray 10 so that the prober 14 cannot raise the wafer 12 high enough to strike the protective cover 4.

Figure 6:
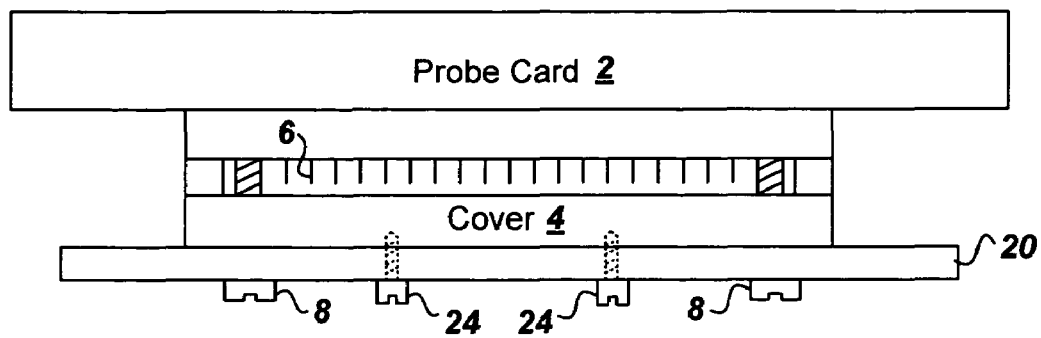
FIG. 6 illustrates one embodiment wherein the protective bar is attached to the protective cover by separate screws than the screws used to attach the protective cover to the probe card.

FIG. 6 illustrates an alternative embodiment of the present invention wherein the protective elongate member 20 is attached to the protective cover 4 by separate screws 24 than the screws 8 used to attach the protective cover 4 to the probe card 2. With the separate screws 24, when the protective cover 4 is removed from the probe card 2 by taking out screws 8, the protective elongate member 20 remains attached. Without the separate screws 24, when the protective cover 4 is removed, an operator may forget to reinstall the protective elongate member 20 when the protective cover 4 is reinstalled, or the protective elongate member 20 can be separated from the protective cover and lost.

Figure 7:
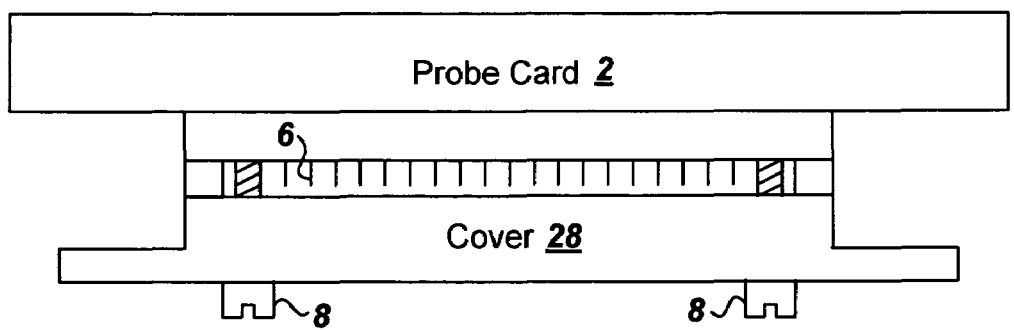
FIG. 7 illustrates one embodiment wherein the protective bar is formed as a part of the protective cover.

FIG. 7 illustrates one embodiment wherein the protective elongate member is formed as a part of the protective cover, or is otherwise permanently attached to create combined protective cover 28. The combined protective cover 28 serves the purpose of the separate screws 8 of FIG. 6, in that the combined protective cover 28 will not be separated from the protective elongate member when the combined protective cover 28 is removed from the probe card 2.

Although the present invention has been described above with particularity, this was merely to teach one of ordinary skill in the art how to make and use the invention. Many additional modifications will fall within the scope of the invention, as that scope is defined by the following claims.

What is claimed is:

1. A system, comprising:
   a probe card;
   a probe card cover to prevent damage to probes on the probe card, the probe card cover being detachably coupled to the probe card to cover the probes;
   an elongate protective structure having a length extending longer than the probe card cover, the elongate protective structure being attached to the probe card cover; and
   a probe card holder tray for mounting the probe card when the probe card is being used to test components on a wafer, wherein the length of the elongate protective structure is greater than a length of an opening in the probe card holder tray to prevent any portion of the probe card cover from extending within any portion of the opening in the probe card holder tray.

2. The system of claim 1, wherein the elongate protective structure comprises a bar.

3. The system of claim 1, wherein the elongate protective structure comprises a plate.

4. The system of claim 1, wherein the elongate protective structure is flexible.

5. The system of claim 1 further comprising an attachment mechanism to attach the probe card cover to the probe card, wherein the attachment mechanism further attaches the elongate protective structure to the probe card cover.

6. The system of claim 5, wherein the attachment mechanism comprises screws.

7. The system of claim 1, further comprising an attachment mechanism to attach the elongate protective structure to the probe card cover separate from an attachment device attaching the protective cover to the probe card.

8. The system of claim 7, wherein the attachment mechanism comprises screws.

9. The system of claim 1, wherein the wafer includes programmable logic devices.

10. The system of claim 1, further comprising:
    a prober chuck for mounting a wafer, wherein when the prober chuck is lifted to contact the wafer, the probe card cover attachment device when the probe card is mounted in the probe card holder tray will strike the wafer.

11. The system of claim 1, further comprising:
    a prober chuck for mounting a wafer; and
    a probe card cover attachment device for attaching the probe card cover to the probe card,
    wherein when the prober chuck is lifted to contact the wafer, the probe card cover attachment device can strike the wafer when the elongate protective structure is not attached, but not when the elongate protective structure is attached.

12. A method for protecting a probe card comprising attaching a bar to a probe card cover of the probe card, wherein the bar extends longer than an opening in a probe card holder tray for mounting the probe card, and wherein at least a portion of the probe card cover extends through the opening in the probe card holder tray when the bar is not attached, and wherein any portion of the probe card cover is prevented from extending within any portion of the opening in the probe card holder tray when the bar is attached.

13. The method of claim 12, wherein attaching the bar comprises using screws to connect the bar to the probe card cover.

14. The method of claim 12, wherein attaching the bar comprises forming the bar integrally with the probe card cover.

\* \* \* \* \*